United States Patent
Akahane

(10) Patent No.: US 10,050,525 B2
(45) Date of Patent: Aug. 14, 2018

(54) SIGNAL TRANSMISSION CIRCUIT

(71) Applicant: FUJI ELECTRIC CO., LTD., Kawasaki-shi (JP)

(72) Inventor: Masashi Akahane, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/789,199

(22) Filed: Jul. 1, 2015

(65) Prior Publication Data
US 2015/0303811 A1    Oct. 22, 2015

Related U.S. Application Data

(63) Continuation of application No. PCT/JP2014/063929, filed on May 27, 2014.

(30) Foreign Application Priority Data

Jun. 25, 2013  (JP) ................. 2013-133228

(51) Int. Cl.
  *H02M 3/158* (2006.01)
  *H02M 3/156* (2006.01)
  (Continued)

(52) U.S. Cl.
  CPC ............. *H02M 3/156* (2013.01); *H02M 1/32* (2013.01); *H02M 3/158* (2013.01); *H03K 17/18* (2013.01);
  (Continued)

(58) Field of Classification Search
  CPC ..... G05F 3/18; G05F 3/22; G05F 3/24; G05F 1/56; H02M 1/15
  See application file for complete search history.

(56) References Cited

U.S. PATENT DOCUMENTS 3,798,596 A    3/1974  Sumiyoshi et al.
5,079,688 A *  1/1992  Kido .................. G06F 1/30
                                              340/650
(Continued)

FOREIGN PATENT DOCUMENTS

JP    08330929 A    12/1996
JP    9-200017 A     7/1997
(Continued)

OTHER PUBLICATIONS

Extended European Search Report issued in European Appln. No. 14818518.4 dated Jun. 30, 2016.
(Continued)

*Primary Examiner* — Nguyen Tran
*Assistant Examiner* — Monica Mata
(74) *Attorney, Agent, or Firm* — Rossi, Kimms & McDowell LLP

(57) ABSTRACT

Included are an output circuit, provided in a high side circuit, that selectively generates and outputs multiple kinds of pulse signal in accordance with the level of priority of a multiple of signals, a switch element, driven so as to be turned on and off by a pulse signal output from the output circuit, that is turned on and off to transmit the power supply voltage of the high side circuit to a low side circuit, a voltage conversion circuit, provided in the low side circuit, that converts the power supply voltage transmitted via the switch element into a pulse signal in the low side circuit, and a signal analysis circuit that analyzes the pulse signal obtained via the power conversion circuit and restores the multiple of signals.

7 Claims, 18 Drawing Sheets

(51) Int. Cl.
*H02M 1/32* (2007.01)
*H03K 17/18* (2006.01)
*H03K 19/0185* (2006.01)
*H02M 1/08* (2006.01)

(52) U.S. Cl.
CPC ....... *H03K 19/018521* (2013.01); *H02M 1/08* (2013.01); *H03K 2217/0063* (2013.01); *H03K 2217/0072* (2013.01)

(56) References Cited

U.S. PATENT DOCUMENTS

| | | |
|---|---|---|
| 5,543,994 A | 8/1996 | Wilhelm et al. |
| 5,917,359 A | 6/1999 | Fukunaga et al. |
| 6,181,587 B1 | 1/2001 | Kuramoto et al. |
| 6,208,280 B1 | 3/2001 | Baker et al. |
| 6,529,061 B1 | 3/2003 | Orita |
| 8,253,472 B2 | 8/2012 | Nishijima et al. |
| 2002/0039269 A1* | 4/2002 | Kumagai ............. H02M 1/32 361/93.1 |
| 2003/0012040 A1 | 1/2003 | Orita et al. |
| 2003/0030394 A1 | 2/2003 | Majumdar et al. |
| 2011/0043269 A1 | 2/2011 | Nishijima et al. |
| 2011/0134710 A1 | 6/2011 | Akahane |
| 2012/0081149 A1 | 4/2012 | Akahane |

FOREIGN PATENT DOCUMENTS

| | | |
|---|---|---|
| JP | 11017508 A | 1/1999 |
| JP | 2886495 B2 | 4/1999 |
| JP | 2002027665 A | 1/2002 |
| JP | 2003032102 A | 1/2003 |
| JP | 2005184656 A | 7/2005 |
| JP | 2007082360 A | 3/2007 |
| JP | 2011044770 A | 3/2011 |
| WO | 2008101548 A1 | 8/2008 |

OTHER PUBLICATIONS

International Search Report issued in PCT/JP2014/063929, dated Aug. 12, 2014. English translation provided.
Extended European Search Report issued in European Appln. No. 14817721.5 dated Aug. 17, 2016.
Notice of Allowance issued in U.S. Appl. No. 14/789,565 dated Apr. 19, 2017.

* cited by examiner

| INPUT | | | OUTPUT | | | ABNORMALITY CATEGORY |
|---|---|---|---|---|---|---|
| OHIN | UVIN | OCIN | OHE | UVE | OCE | |
| 0 | 0 | 0 | 0 | 0 | 0 | NONE |
| 1 | X | X | 1 | 0 | 0 | OVERHEAT |
| 0 | 1 | X | 0 | 1 | 0 | LOW VOLTAGE |
| 0 | 0 | 1 | 0 | 0 | 1 | OVERCURRENT |

"X" INDICATES "DON'T CARE"

FIG.3

| ABNORMALITY CATEGORY | SIGNAL STATUS | PM1 | PM2 | OPERATION |
|---|---|---|---|---|
| NONE | OCE=OHE=UVE=0 | OFF | OFF | DO NOTHING |
| OVERCURRENT | OCE=1 | ON | OFF | OUTPUT PM1 SIDE CONTINUOUS PULSE |
| OVERHEAT | OHE=1 | OFF | ON | OUTPUT PM2 SIDE CONTINUOUS PULSE |
| LOW VOLTAGE | UVE=1 | ON | OFF | OUTPUT PM1 AND PM2 PULSE ALTERNATELY |
| | | OFF | ON | |

FIG.4

| | LATCH OUTPUT CATEGORY | BIT [0] | BIT [0] | OUTPUT ERDET | OUTPUT OHER | OUTPUT OCER | OUTPUT UVER | OUTPUT RXER | REMARKS |
|---|---|---|---|---|---|---|---|---|---|
| 0 | OHR | 0 | 0 | 0 | 0 | 0 | 0 | 0 | NO ABNORMALITY |
| | OCR | 0 | 0 | | | | | | |
| 1 | OHR | 1 | 1 | 1 | 1 | 0 | 0 | 0 | OVERHEAT |
| | OCR | 0 | 0 | | | | | | |
| 2 | OHR | 0 | 0 | 1 | 0 | 1 | 0 | 0 | OVERCURRENT |
| | OCR | 1 | 1 | | | | | | |
| 3 | OHR | 1(0) | 0(1) | 1 | 0 | 0 | 1 | 0 | LOW VOLTAGE |
| | OCR | 0(1) | 1(0) | | | | | | |
| 4 | OHR | 1 | 0(1) | 1 | 0 | 0 | 0 | 1 | RECEPTION ABNORMALITY |
| | OCR | 1 | 1(0) | | | | | | |

FIG.9

| LATCH OUTPUT (LT4) | DECODER OUTPUT | | |
|---|---|---|---|
| | ALM1 | ALM2 | ALM3 |
| 3~4 | H | L | L |
| 5~6 | L | H | L |
| 7~8 | L | L | H |
| 9~ | L | L | L |

FIG.18

SIGNAL TRANSMISSION CIRCUIT

CROSS-REFERENCE TO RELATED CASES

This application is a continuation of International Application No. PCT/JP2014/063929, filed on May 27, 2014, which is based on and claims priority to Japanese Patent Application No. JP 2013-133228, filed on Jun. 25, 2013. The disclosure of the Japanese priority application and the PCT application in their entirety, including the drawings, claims, and the specification thereof, are incorporated herein by reference.

BACKGROUND

1. Field of the Invention

The present invention relates to a signal transmission circuit suitable for reducing the level of multiple kinds of alarm signal in a high side circuit and transmitting the signals to a low side circuit.

2. Related Art

A power converter including two switching elements Q1 and Q2, connected in a totem pole configuration to form a half-bridge circuit, that switch direct current voltage by alternately carrying out on/off operations is known as a power converter that drives an alternating current load. For example, a high voltage integrated circuit HVIC that includes a high side circuit including a high side driver that drives the upper arm side switching element Q1 so as to be turned on and off and a low side circuit including a low side driver that drives the lower arm side switching element Q2 so as to be turned on and off is used as a drive circuit of this kind of power converter.

Herein, the high side circuit is configured so as to operate by receiving a predetermined power supply voltage VB (>VS), with a midpoint potential VS of the half-bridge circuit, which is a first potential, as a reference potential. Also, the low side circuit is configured so as to operate by receiving a predetermined power supply voltage VCC (>GND), with a ground potential (second potential) GND of the half-bridge circuit lower than the midpoint potential (first potential) VS as a reference potential.

Herein, a protective circuit that protects the switching elements Q1 and Q2 by detecting an abnormality such as overcurrent or overheat in the switching elements Q1 and Q2, and a signal output circuit that transmits an abnormality detection signal to a control circuit portion of the high side circuit and low side circuit, are provided in the high side circuit and low side circuit. However, the high side circuit, as previously described, is configured so as to operate with the midpoint potential VS of the half-bridge circuit as a reference potential. Therefore, in order to transmit the abnormality detection signal to the control circuit portion that operates with the ground potential GND as a reference potential, it is necessary to reduce the level of the abnormality detection signal.

Therefore, to date, a voltage signal Vin, which is an abnormality detection signal on the high side, has been converted into current via a voltage-current converter, and the current is transmitted to the low side via a high breakdown voltage resistor formed of a transistor ND1. Further, by the current transmitted via the high breakdown voltage resistor being converted into voltage via a current-voltage converter on the low side, a level-reduced output voltage Vout is obtained. This method is introduced in detail in, for example, Japanese Patent Application Publication No. JP-A-2003-32102 (also referred to herein as "PTL 1").

Also, an abnormality detection signal being transmitted to the low side via a grounded source amplifier circuit, formed of a PMOS transistor driven so as to be turned on and off by a high side abnormality detection signal, and a resistor connected to the drain of the PMOS transistor, and voltage generated in the resistor being taken into the low side, is proposed in, for example, Japanese Patent No. 2,886,495 (also referred to herein as "PTL 2").

However, when using the level reduction circuits with the configurations introduced in PTL 1 and 2, a quantity of level reduction circuits in accordance with the quantity of signals are necessary in order to transmit multiple kinds of signal from the high side. Moreover, a so-called high side circuit provided on the high side of a level reduction circuit normally carries out a floating operation. Therefore, potential fluctuation accompanying charging and discharging of a parasitic capacitor of the PMOS transistor is liable to occur due to fluctuation in the high side circuit power supply voltage (dV/dt), and there is concern of the level reduction circuit malfunctioning.

SUMMARY OF INVENTION

The invention, having been contrived bearing in mind this kind of situation, has an object of providing a signal transmission circuit with a simple configuration such that multiple kinds of abnormality detection signal on a high side circuit can be reduced in level and reliably transmitted to a low side circuit, unaffected by fluctuation in the power supply voltage of the high side circuit.

Solution to Problem

In order to achieve the heretofore described object, a signal transmission circuit according to the invention is characterized by including an output circuit, provided in a high side circuit that operates with a first potential as a reference potential, that selectively generates and outputs a plurality of kinds of pulse signal in accordance with the level of priority of a plurality of signals representing, for example, abnormality detection signals, a switch element formed of, for example, a MOS transistor, driven so as to be turned on and off by a pulse signal output from the output circuit, that is turned on and off to transmit the power supply voltage of the high side circuit to a low side circuit that operates with a second potential lower than the first potential as a reference potential, a voltage conversion circuit, provided in the low side circuit, that converts the power supply voltage transmitted via the switch element into a pulse signal of a predetermined voltage with the second potential as a reference potential, and a signal analysis circuit that analyzes the pulse signal obtained via the power conversion circuit and restores the plurality of signals.

Preferably, the output circuit, for example, selectively generates a plurality of kinds of pulse signal that alternatively cause a plurality of the switch element provided in parallel to be turned on, and the voltage conversion circuit converts each of the voltages selectively transmitted via the switch elements into a pulse signal with the second potential as a reference potential, and outputs the plurality of kinds of pulse signal in parallel. Further, the signal analysis circuit is configured so as to include in parallel multiple stage latch circuits that sequentially latch by category the plurality of kinds of pulse signal in synchronization with a clock signal generated from the plurality of kinds of pulse signal output in parallel from the voltage conversion circuit, analyze the signal level held in each of the latch circuits, and restore the plurality of signals.

Specifically, the clock signal, for example, is generated as a signal synchronized with the inversion timing of one of the plurality of kinds of pulse signal output in parallel from the voltage conversion circuit.

Also, it is desirable that the signal analysis circuit includes a function of determining that there is a reception error when the signal level held in each of the latch circuits indicates that the plurality of switch elements are simultaneously in an on-state.

Alternatively, the output circuit, for example, is configured so as to turn the switch element on and off by generating pulse signals of differing pulse widths in accordance with signal category in accordance with the level of priority of the plurality of signals. Further, the voltage conversion circuit is configured so as to convert the voltage selectively transmitted via each switch element into a pulse signal with the second potential in the low side circuit as a reference potential and charge a capacitor for the duration of the pulse signal. Furthermore, it is also preferable that the signal analysis circuit is configured so as to determine the charge voltage of the capacitor and restore the plurality of signals.

Also, the output circuit, for example, is configured so as to turn the switch element on and off by generating pulse signal trains of differing pulse numbers in accordance with signal category in accordance with the level of priority of the plurality of signals. Further, the voltage conversion circuit is configured so as to convert the voltage selectively transmitted via each switch element into a pulse signal with the second potential in the low side circuit as a reference potential and charge a capacitor for a certain time each time the pulse signal is detected. Further, it is also desirable that the signal analysis circuit is configured so as to determine the charge voltage of the capacitor after the certain time and restore the plurality of signals.

According to the signal transmission circuit with the heretofore described configuration, multiple kinds of pulse signal are selectively generated in accordance with the level of priority of multiple kinds of abnormality detection signal in a high side circuit, and the pulse signal is transmitted to a level-reduced low side circuit, because of which there is no effect from fluctuation in the power supply voltage of the high side circuit, which carries out a floating operation. Moreover, as the pulse signal is transmitted via a switch element that alternatively carries out an on-state operation in accordance with the pulse signal, the pulse signal can be accurately transmitted, unaffected by, for example, in-phase noise or the like.

Also, the signal transmission circuit according to the invention is of a configuration such that multiple kinds of pulse signal are selectively generated by multiple kinds of switch element provided in parallel being alternatively turned on in accordance with the level of priority of multiple kinds of abnormality detection signal, or pulse signals of differing pulse widths or pulse numbers are generated in accordance with the category of the abnormality detection signal, and transmitted to a low side circuit. Consequently, a level reduction circuit formed of the switch element and voltage conversion circuit can be configured simply. Moreover, the output circuit and signal analysis circuit can be easily constructed using a logic circuit, comparator, and the like. Consequently, advantages are achieved in that the whole configuration including the high side circuit and low side circuit can be realized at low cost and simply, and the like.

BRIEF DESCRIPTION OF DRAWINGS

FIG. 3 is a diagram showing an arbiter circuit processing function;

FIG. 4 is a diagram showing examples of a pulse signal generated by a pulse generator circuit in accordance with the output of the arbiter circuit;

FIG. 9 is a diagram showing a configuration example of a signal analysis circuit shown in FIG. 2;

FIG. 18 is a diagram showing a configuration example of a decoder shown in FIG. 16;

DETAILED DESCRIPTION

Figure 1:
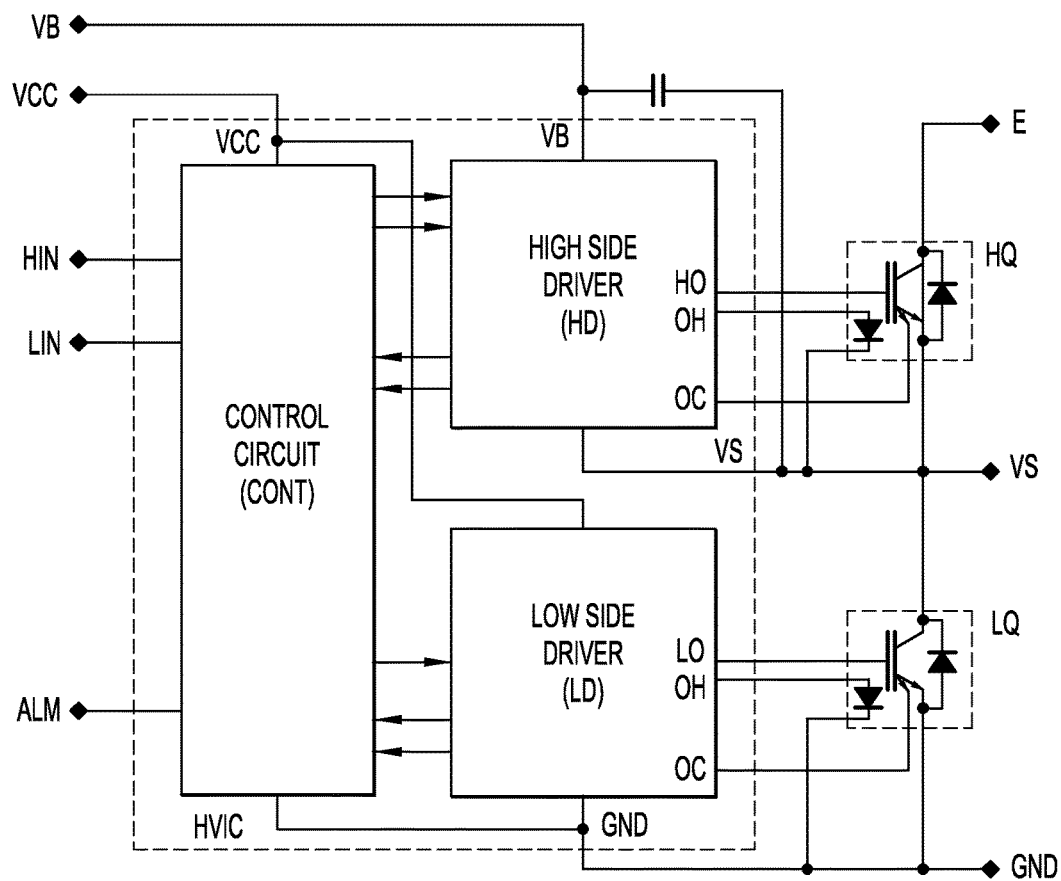
FIG. 1 is a schematic configuration diagram of a power converter configured to include a signal transmission circuit according to the invention.

Hereafter, referring to the drawings, a description will be given of a signal transmission circuit according to embodiments of the invention.

FIG. 1 is a main portion schematic configuration diagram of a power converter configured to include a signal transmission circuit according to the invention. In FIG. 1, HQ and LQ are switching elements, formed of, for example, IGBTs and connected in a totem pole configuration to form a half-bridge circuit, that switch a direct current voltage E by alternately carrying out on/off operations.

The upper arm side switching element HQ is driven so as to be turned on and off by a high side driver HD that operates by receiving a control signal from a control circuit CONT. Also, the lower arm side switching element LQ is driven so as to be turned on and off by a low side driver LD that operates by receiving a control signal from the control circuit CONT. The control circuit CONT, high side driver HD, and low side driver LD are integrated in, for example, a high voltage integrated circuit HVIC.

Herein, the high side driver HD is configured so as to operate by receiving a predetermined power supply voltage VB (>VS), with the half-bridge circuit midpoint potential VS, which is a first potential, as a reference potential. Also, each of the low side driver LD and control circuit CONT is configured so as to operate by receiving a predetermined power supply voltage VCC (>GND), with the half-bridge circuit ground potential GND, which is a second potential lower than the midpoint potential VS, as a reference potential. Consequently, the high side driver HD will herein be called the high side circuit, and the low side driver LD and control circuit CONT will be called the low side circuit.

Herein, the high side driver HD and low side driver LD perform a role of driving the switching elements HQ and LQ respectively so as to be turned on and off. Furthermore, the high side driver HD and low side driver LD include a function of monitoring the current flowing through the switching elements HQ and LQ respectively, and the operating temperature thereof. The current detection is carried out via, for example, a current detecting emitter provided in each of the switching elements HQ and LQ. Also, the temperature detection is carried out via, for example, a temperature detecting diode integrally installed in each of the switching elements HQ and LQ.

Further, the high side driver HD and low side driver LD include functions of protecting the switching elements HQ and LQ by stopping the drive of the switching elements HQ and LQ when an abnormality such as overcurrent or overheat is detected, and of transmitting an abnormality detection signal to the control circuit CONT. At this time, it is necessary to reduce the level of the abnormality detection signal transmitted to the control circuit CONT from the high side driver HD, which is the high side circuit, to the reference potential of the control circuit CONT.

Figure 2:
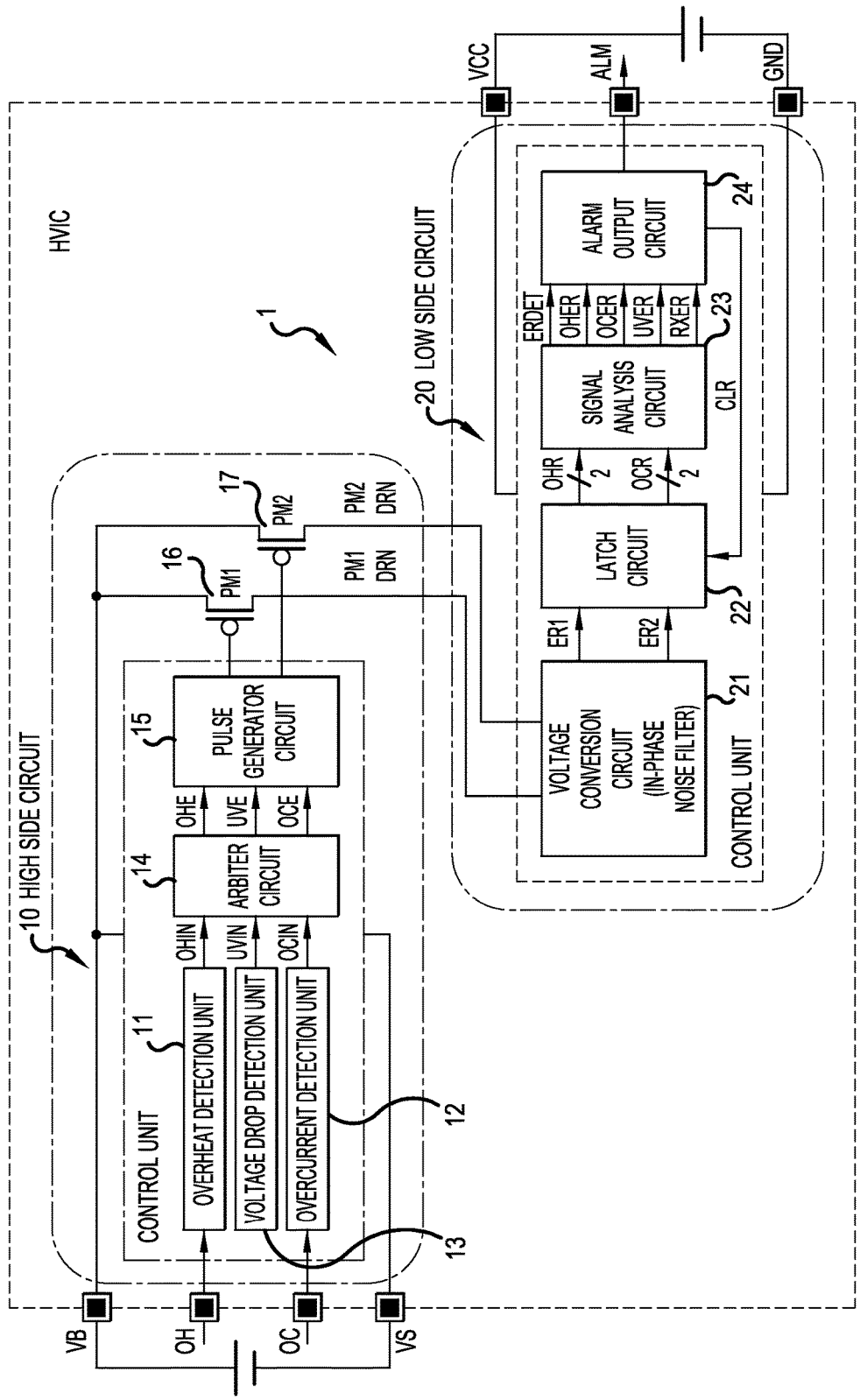
FIG. 2 is a main portion schematic configuration diagram of a signal transmission circuit according to a first embodiment of the invention.

FIG. 2 is a main portion schematic configuration diagram of a signal transmission circuit 1 according to a first embodiment of the invention, wherein 10 is the previously described high side circuit provided in the HVIC, and 20 is the low side circuit. The signal transmission circuit 1 performs a role of reducing the level of multiple kinds of abnormality detection signal OHE, OCE, and UVE detected in the high side circuit 10 (specifically, in the high side driver HD), and transmitting the signals to the low side circuit 20. The abnormality detection signal OHE is a signal indicating overheat detected by an overheat detection unit 11, the abnormality detection signal OCE is a signal indicating overcurrent detected by an overcurrent detection unit 12, and the abnormality detection signal UVE is a signal indicating a voltage drop detected by a voltage drop detection unit 13.

The signal transmission circuit 1 includes an arbiter circuit 14 that outputs multiple kinds of abnormality detection input OHIN, OCIN, and UVIN input from the detection units 11, 12, and 13 in accordance with the level of priority thereof. The arbiter circuit 14, basically on a first come, first served basis, outputs the abnormality detection signals OHE, OCE, and UVE in accordance with the abnormality detection inputs OHIN, OCIN, and UVIN. However, when the multiple kinds of abnormality detection input OHIN, OCIN, and UVIN are generated simultaneously, the arbiter circuit 14 outputs the abnormality detection signals OHE, UVE, and OCE in an order of priority such that "OHIN>UVIN>OCIN", as shown in, for example, FIG. 3.

Also, the signal transmission circuit 1 includes a pulse generator circuit 15 that generates a pulse signal in accordance with the abnormality detection signals OHE, OCE, and UVE output from the arbiter circuit 14. Furthermore, the signal transmission circuit 1 includes in parallel two switch elements 16 and 17 for transmitting the abnormality detection signals OHE, OCE, and UVE to the low side circuit 20. The switch elements 16 and 17 are formed of, for example, high breakdown voltage p-channel MOSFETs PM1 and PM2. The switch elements 16 and 17 are such that the source of each is connected to the power supply voltage VB, while the drain is connected to a voltage conversion circuit, to be described hereafter, of the low side circuit 20. The pulse generator circuit 15 generates a multiple of pulse signals in accordance with the abnormality detection signals OHE, OCE, and UVE at a timing such that the switch elements 16 and 17 are not turned on simultaneously, and applies the pulse signals to the gate of each of the switch elements 16 and 17.

Specifically, the pulse signal is a continuous pulse signal that continuously turns the switch element 17 on and off in a first cycle when the abnormality detection signal OHE indicating overheat is output, as shown in, for example, FIG. 4. Also, the pulse signal is a continuous pulse signal that continuously turns the switch element 16 on and off in a first cycle when the abnormality detection signal OCE indicating overcurrent is output. Further, the pulse signal is a pulse signal that alternately turns the two switch elements 16 and 17 on and off in a second cycle longer than the first cycle when the abnormality detection signal UVE indicating a voltage drop is output.

That is, the arbiter circuit 14 generates the abnormality detection signals OHE, OCE, and UVE in accordance with the state of occurrence of an overheat abnormality, overcurrent abnormality, and voltage drop abnormality. Further, the pulse generator circuit 15, under the management of the arbiter circuit 14, generates pulse signals that drive each of the switch elements 16 and 17 so as to be turned on and off in accordance with the abnormality detection signals OHE, OCE, and UVE, as shown in, for example, FIG. 5.

Figure 5:
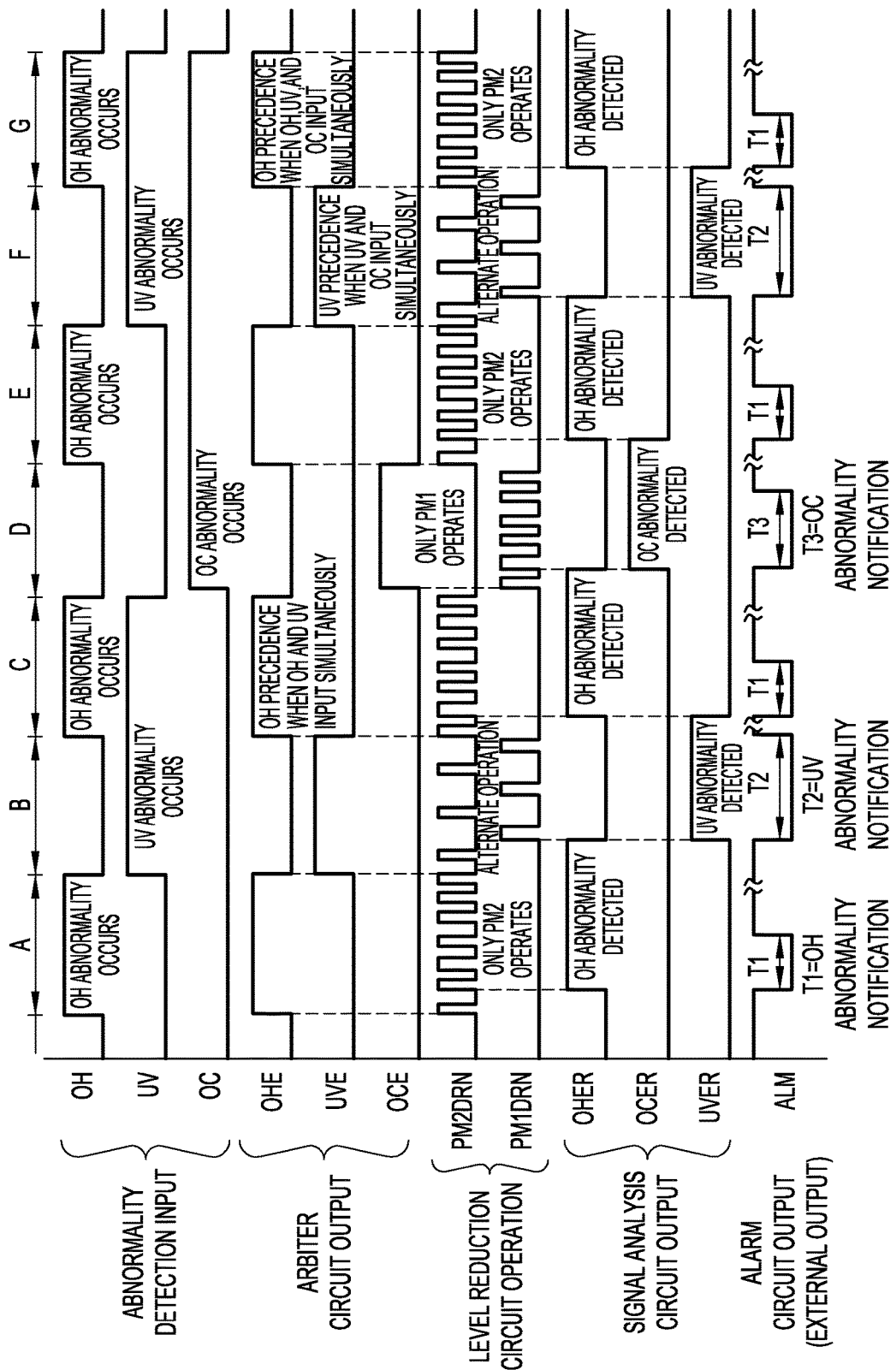
FIG. 5 is a timing diagram showing an aspect of signal transmission according to the signal transmission circuit shown in FIG. 2.

Specifically, when only an overheat abnormality occurs, only the switch element 17 is driven so as to be turned on and off in the first cycle, as shown in an interval A in FIG. 5. Also, when only a voltage drop abnormality occurs, the switch elements 16 and 17 are driven so as to be alternately turned on and off in the second cycle, as shown in an interval B. Further, when the overheat abnormality and voltage drop abnormality occur simultaneously, the overheat abnormality takes precedence over the voltage drop abnormality, and only the switch element 17 is driven so as to be turned on and off in the first cycle, as shown in an interval C.

Also, when only an overcurrent abnormality occurs, only the switch element 16 is driven so as to be turned on and off in the first cycle, as shown in an interval D in FIG. 5. Also, when the overheat abnormality occurs simultaneously in addition to an overcurrent abnormality, only the switch element 17 is driven so as to be turned on and off in the first cycle, in precedence to the drive of the switch element 16, as shown in an interval E. Also, when the overcurrent abnormality and voltage drop abnormality occur simultaneously, the switch elements 16 and 17 are alternately driven so as to be turned on and off in the second cycle, as shown in an interval F. Further, when a voltage drop abnormality occurs simultaneously together with the overheat abnormality and overcurrent abnormality, the overheat abnormality takes precedence, and only the switch element 17 is driven so as to be turned on and off in the first cycle, as shown in an interval G.

Meanwhile, the low side circuit 20 includes the voltage conversion circuit 21 that converts the voltage of, and takes in, the heretofore described pulse signals transmitted via the switch elements 16 and 17, and generates a pulse signal with the ground potential GND, which is the reference potential of the low side circuit 20, as a reference. The voltage conversion circuit 21 is configured to include a voltage conversion unit 21a and in-phase noise filter 21b, as shown in, for example, FIG. 6, and is realized to include a pulse generation function of restoring the pulse signals.

Figure 6:
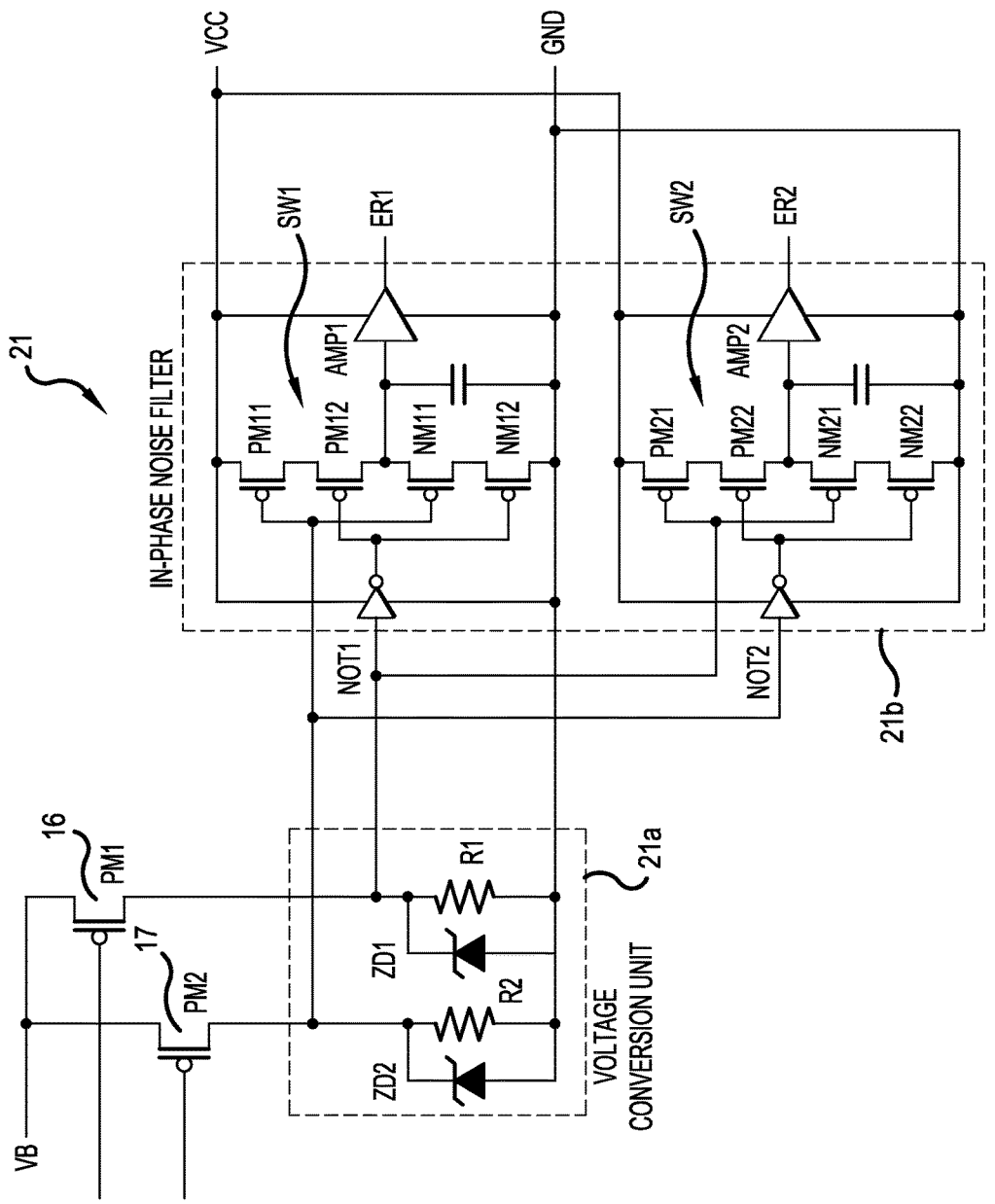
FIG. 6 is a diagram showing a configuration example of a voltage conversion circuit shown in FIG. 2.

Specifically, as shown in, for example, FIG. 6, the voltage conversion unit 21a in the voltage conversion circuit 21 is formed of resistors R1 and R2 connected in series with the drain of each of the switch elements 16 and 17, and Zener diodes ZD1 and ZD2, connected in parallel with the resistors R1 and R2 respectively, that clamp voltage generated in the resistors R1 and R2. Further, the voltage conversion unit 21a is configured so as to restore the pulse signals, with the ground potential GND as a reference, as the voltage generated in the resistors R1 and R2.

Figure 7:
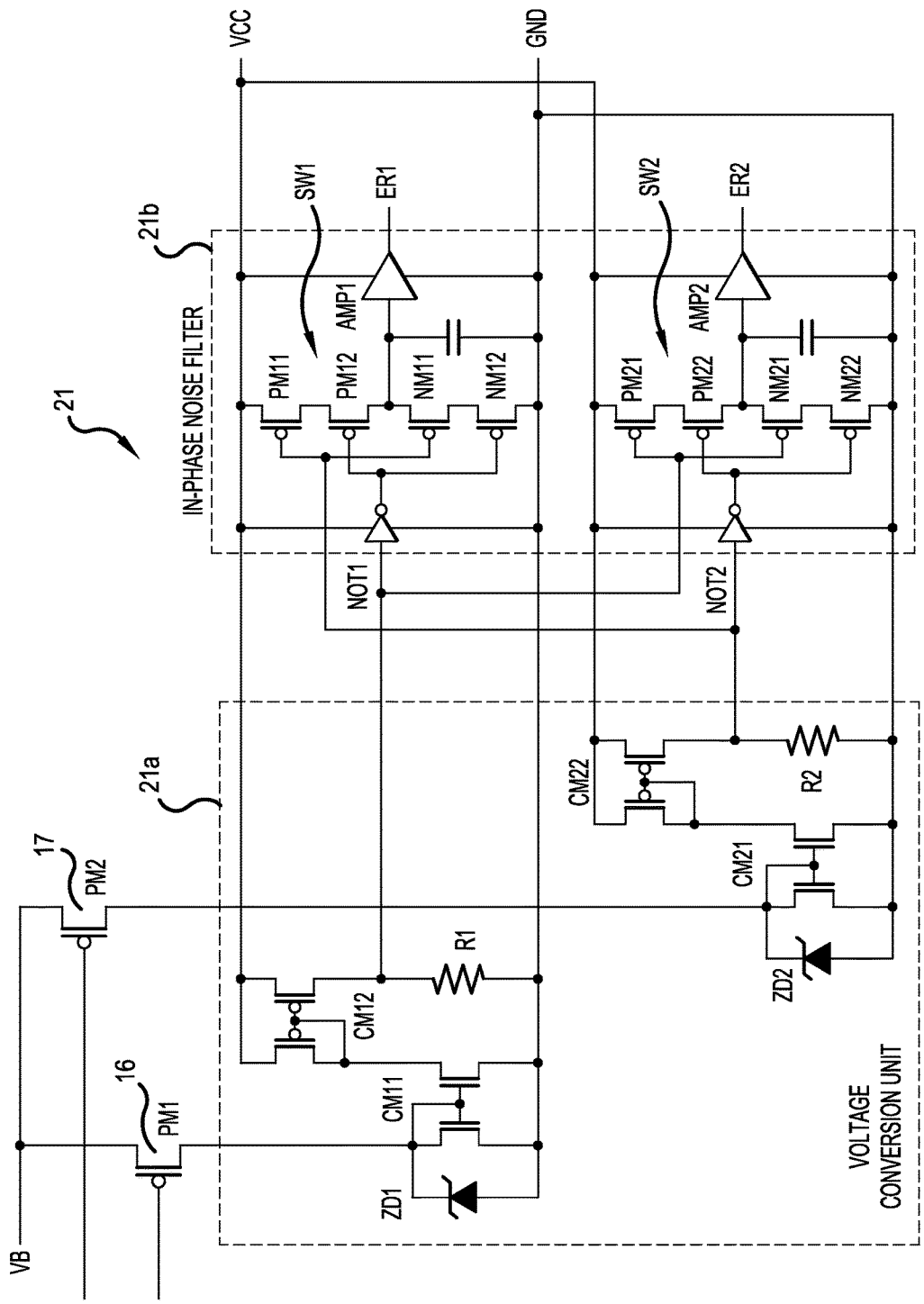
FIG. 7 is a diagram showing a modification example of a voltage conversion circuit shown in FIG. 2.

The voltage conversion unit 21a can also be configured using first current mirror circuits CM11 and CM21, formed of a pair of n-channel MOSFETs, and second current mirror circuits CM12 and CM22, formed of a pair of p-channel MOSFETs, as shown in, for example, FIG. 7. In this case, the drain-to-source voltages of the first current mirror circuits CM11 and CM21 are clamped by the Zener diodes ZD1 and ZD2.

Further, the second current mirror circuits CM12 and CM22 are driven by the output of the first current mirror circuits CM11 and CM21, and voltage is generated in the resistors R1 and R2 by the output current of the second current mirror circuits CM12 and CM22. Consequently, the voltage conversion unit 21a configured in this way is also such that the pulse signals transmitted via the switch elements 16 and 17 are restored as the voltage generated in the resistors R1 and R2 as pulse signals having the ground potential GND as a reference.

Also, the in-phase noise filter 21b is configured as switch circuits SW1 and SW2 by two stages each of p-channel MOSFETs and n-channel MOSFETs, a total of four stages, being connected in a totem pole configuration, as shown in, for example, each of FIG. 6 and FIG. 7. A first stage p-channel MOSFET PM11 and third stage n-channel MOSFET NM11 in the first switch circuit SW1 carry out on/off operations in a complementary way by a pulse signal obtained from the resistor R2 being input into the gates thereof. Also, a second stage p-channel MOSFET PM12 and fourth stage n-channel MOSFET NM12 carry out on/off operations in a complementary way by a pulse signal obtained from the resistor R1 and inverted via a NOT circuit NOT1 being input into the gates thereof.

Consequently, when pulse signals are input simultaneously via the switch elements 16 and 17, the first switch circuit SW1 prohibits the output of the pulse signals. Further, when the pulse signal is input via only the switch element 16, the first switch circuit SW1 outputs the pulse signal. A pulse signal on which an in-phase filtering process has been carried out in this way, obtained at a connection point of the p-channel MOSFET PM12 and third stage n-channel MOSFET NM11, is output via an output amplifier AMP1 as an abnormality detection signal ER1.

Also, in the same way, the first stage p-channel MOSFET PM21 and third stage n-channel MOSFET NM21 in the second switch circuit SW2 carry out on/off operations in a complementary way by a pulse signal obtained from the resistor R1 being input into the gates thereof. Also, the second stage p-channel MOSFET PM22 and fourth stage n-channel MOSFET NM22 carry out on/off operations in a complementary way by a pulse signal obtained from the resistor R2 and inverted via a NOT circuit NOT2 being input into the gates thereof.

Consequently, when pulse signals are input simultaneously via the switch elements 16 and 17, the second switch circuit SW2, in the same way as the first switch circuit SW1, prohibits the output of the pulse signals. Further, when the pulse signal is input via only the switch element 17, the second switch circuit SW2 outputs the pulse signal. A pulse signal on which an in-phase filtering process has been carried out in this way, obtained at a connection point of the second stage p-channel MOSFET PM22 and third stage n-channel MOSFET NM21, is output via an output amplifier AMP2 as an abnormality detection signal ER2.

Returning here to the description of the configuration of the low side circuit 20, the low side circuit 20 includes a latch circuit 22 that latches a restored pulse signal whose voltage has been converted by the voltage conversion circuit 21, as shown in FIG. 2. Also, the low side circuit 20 includes a signal analysis circuit 23 that analyzes the pulse signal latched by the latch circuit 22, thereby determining the category of the previously described abnormality detection signals. Furthermore, the low side circuit 20 includes an alarm output circuit 24 that outputs an alarm signal ALM in accordance with a signal analysis result, which is the output of the signal analysis circuit 23.

Figure 8:
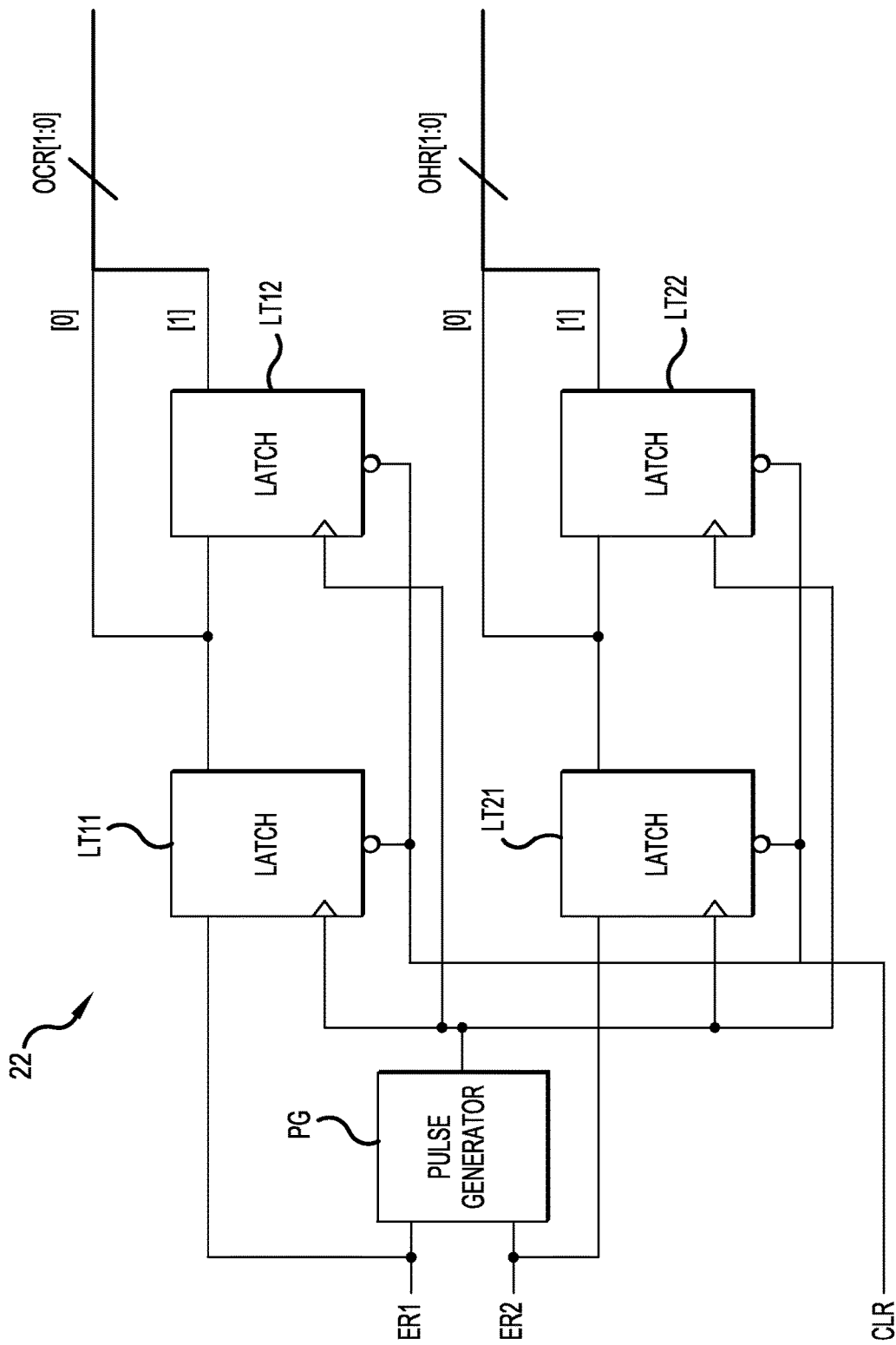
FIG. 8 is a diagram showing a configuration example of a latch circuit shown in FIG. 2.

Specifically, the latch circuit 22 includes in parallel two stage configuration latches LT11 and LT12 and latches LT21 and LT22, which respectively latch the abnormality detection signals ER1 and ER2 formed of the previously described pulse signals, as shown in, for example, FIG. 8. The latches LT11, LT12, LT21, and LT22 carry out a latching operation by receiving a clock signal CLK generated by a pulse generator circuit PG into which the abnormality detection signals ER1 and ER2 are input.

Herein, the pulse generator circuit PG is configured so as to, when one of the pulse signals forming the abnormality detection signals ER1 and ER2 is inverted, generate the clock signal CLK in synchronization therewith. Further, the first stage latches LT11 and LT21 receive the clock signal CLK and latch the abnormality detection signals ER1 and ER2 respectively. Also, the second stage latches LT12 and LT22 latch the abnormality detection signals held in the first stage latches LT11 and LT21 respectively.

Consequently, signals indicating the status of a change in the abnormality detection signals ER1 and ER2 are latched by the previously described two stage configuration latches LT11 and LT12 and latches LT21 and LT22. Further, a total of two bits of signals latched and held in the latches LT11 and LT12 and latches LT21 and LT22 are output as abnormality detection signals OHR and OCR indicating overheat and overcurrent respectively. The latches LT11, LT12, LT21, and LT22 receive a clear signal CLR, to be described hereafter, and are reset and initialized in unison.

The signal analysis circuit 23 that analyzes the abnormality detection signals ER1 and ER2 held by the latch circuit 22 configured in this way determines the category of the abnormality indicated by the abnormality detection signals ER1 and ER2 from the change in the temporal transitional state of the abnormality detection signals ER1 and ER2 in accordance with the logic shown in, for example, FIG. 9. That is, when the abnormality detection signals OHR and OCR are "00" and "00", the signal analysis circuit 23 determines that there is no abnormality. Further, when the abnormality detection signal OHR is "11" and the abnormality detection signal OCR is "00", the signal analysis circuit 23 determines that this is an overheat abnormality.

Also, when the abnormality detection signal OHR is "00" and the abnormality detection signal OCR is "11", the signal analysis circuit 23 determines that this is an overcurrent abnormality. Further, when the abnormality detection signal OHR is "01" or "10" and the abnormality detection signal OCR is "10" or "01", the signal analysis circuit 23 determines that this is a low voltage abnormality. The determination of a low voltage abnormality, as previously described, is based on the fact that when the abnormality detection signal UVE is output, the two switch elements 16 and 17 are alternately turned on and off in a cycle longer than that when the overheat and overcurrent are detected. That is, in this case, the determination is based on the fact that the signals held in the latch circuit 22 differ between the first stage and second stage, and that the abnormality detection signals ER1 and ER2 differ from each other.

Further, when the abnormality detection signals OHR and OCR are both of the same value at "10 (11)" and "11 (10)", the signal analysis circuit 23 determines that this state is a reception abnormality, as the pulse signals are generated under the condition that the switch elements 16 and 17 are not caused to be turned on simultaneously, as previously described. In this case, the clear signal CLR is generated, thereby resetting the latch circuit 22. In this way, the signal analysis circuit 23 that analyzes the abnormality detection signal OHR and abnormality detection signal OCR is realized as a memory into which the abnormality detection signal OHR and abnormality detection signal OCR are input, and which selectively outputs signals ERDET, OHER, OCER, UVER, and RXER indicating the category of the abnormality, which are results of the analysis.

Figure 10:
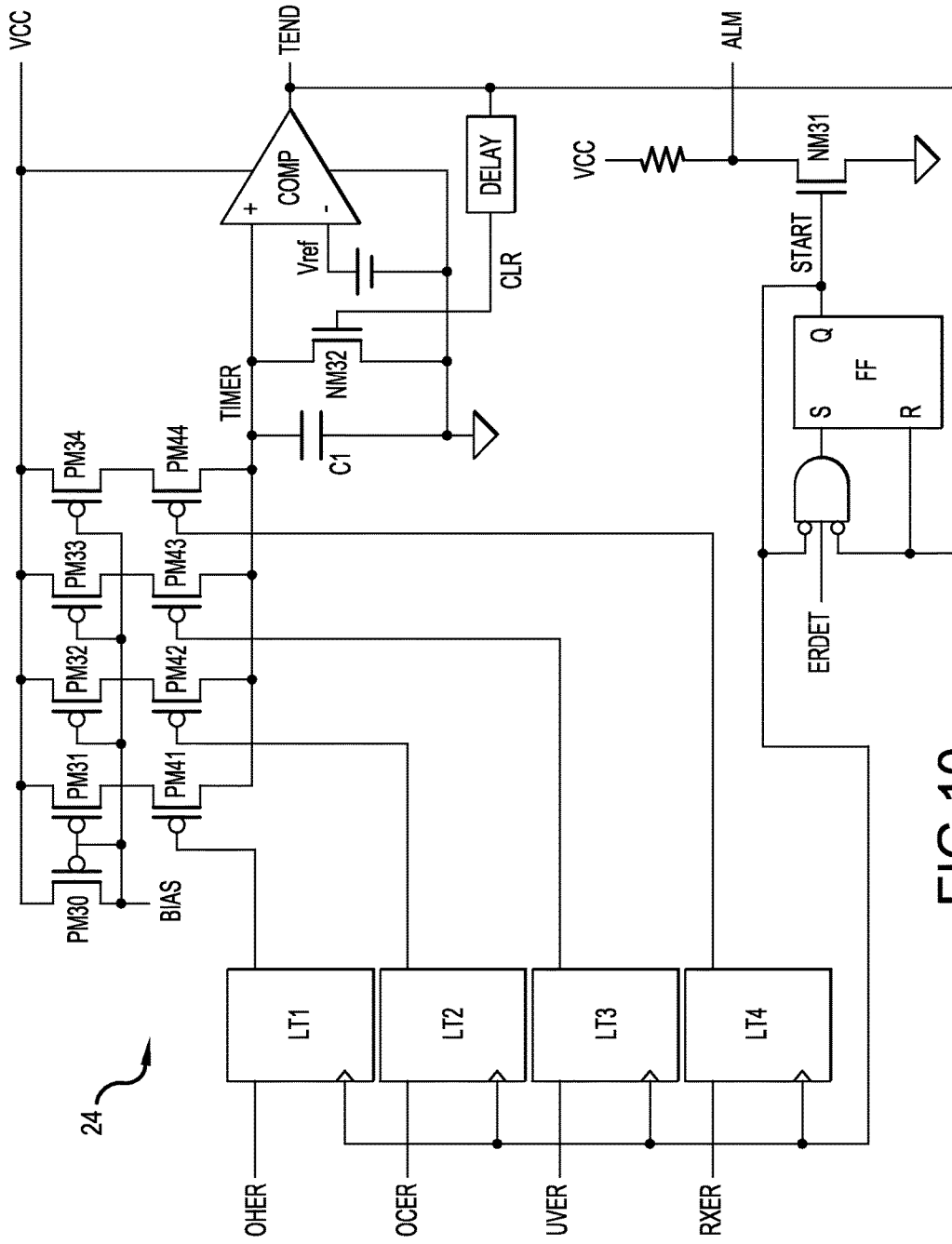
FIG. 10 is a diagram showing a configuration example of an alarm output circuit shown in FIG. 2.

The alarm output circuit 24 into which these kinds of analysis result, that is, the signals ERDET, OHER, OCER, UVER, and RXER, are input includes a flip-flop FF that is set by the abnormality detection signal ERDET being input, as shown in, for example, FIG. 10. Further, the alarm output circuit 24 is configured so that the alarm signal ALM is output by an n-channel MOSFET NM31 being driven so as to be turned on by a set output of the flip-flop FF.

Also, the alarm output circuit 24 includes in parallel four latches LT1, LT2, LT3, and LT4 that receive the set output of the flip-flop FF, and latch the signals OHER, OCER, UVER, and RXER respectively. Furthermore, the alarm output circuit 24 includes in parallel four p-channel MOSFETs PM31, PM32, PM33, and PM34 as a constant current supply forming a current mirror circuit with a p-channel MOSFET PM30. Further, four p-channel MOSFETs PM41, PM42, PM43, and PM44 acting as switches are connected in series with the p-channel MOSFETs PM31, PM32, PM33, and PM34 respectively.

The p-channel MOSFETs PM41, PM42, PM43, and PM44 are selectively turned on by the outputs of the latches LT1, LT2, LT3, and LT4, and perform a role of charging a capacitor C1 with the constant current supply formed of the p-channel MOSFETs PM31, PM32, PM33, and PM34. Further, a charge voltage generated in the capacitor C1 in accompaniment to the charging of the capacitor C1 is applied to a comparator COMP, and compared with a reference voltage Vref. Further, when the charge voltage of the capacitor C1 exceeds the reference voltage Vref, the comparator COMP issues an end signal TEND commanding a stopping of the alarm signal output.

An n-channel MOSFET NM32 connected in parallel with the capacitor C1 is driven so as to be turned on by the end signal TEND via a delay circuit, the charge of the capacitor C1 is released, and the capacitor C1 is reset. Also, the end signal TEND is applied to the reset terminal of the flip-flop FF, and input into an AND gate circuit provided at a stage before the set terminal of the flip-flop FF. The AND gate circuit performs a role of applying the abnormality detection signal ERDET to the set terminal of the flip-flop FF only when the flip-flop FF is in a reset state and the end signal TEND is not being output.

Figure 11:
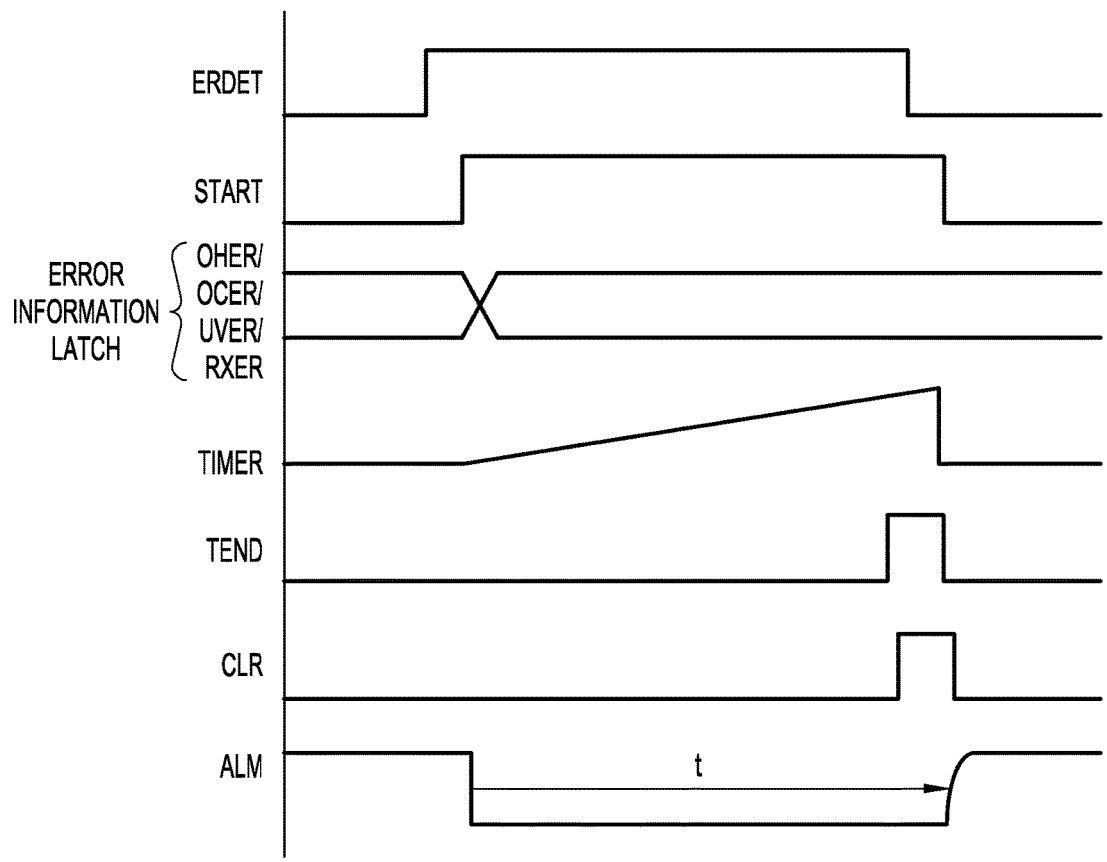
FIG. 11 is a timing diagram showing an operation of the alarm output circuit shown in FIG. 2.

Consequently, the flip-flop FF is set at a timing at which the abnormality detection signal ERDET is input, and after charging of the capacitor C1 is started in accompaniment to the setting, the flip-flop FF is reset when the charge voltage of the capacitor C1 exceeds the reference voltage Vref and the end signal TEND is output, as shown in FIG. 11. As a result of this, the alarm signal ALM is output for a period t in which the flip-flop FF is set.

At this time, provided that the constant current value set in each of the p-channel MOSFETs PM31, PM32, PM33, and PM34 is weighted, the charge current of the capacitor C1 changes in accordance with the category of the signals OHER, OCER, UVER, and RXER. As a result of this, a time difference occurs in the period t until the charge voltage of the capacitor C1 reaches the reference voltage Vref, that is, in the timing at which the end signal TEND is generated. Consequently, it is possible to change the output time of the alarm signal ALM in accordance with the category of the signals OHER, OCER, UVER, and RXER. Further, it is possible to determine the category of the abnormality detection by distinguishing the output time of the alarm signal ALM.

In this way, according to the signal transmission circuit 1 configured in this way, the signals OHER, OCER, and UVER indicating abnormality categories in a predetermined order of priority are generated in accordance with multiple kinds (three kinds in this example) of abnormality detection signal OHIN, OCIN, and UVIN generated in the high side circuit 10. Further, a pulse signal that causes one of the previously described two switch elements 16 and 17 to be continuously turned on and off, or a pulse signal that causes the switch elements 16 and 17 to be alternately turned on, is generated in accordance with the signals OHER, OCER, and UVER. Further, the pulse signals are transmitted to the low side circuit 20 via the switch elements 16 and 17.

Consequently, signal transmission to the low side circuit 20 can be carried out unaffected by power supply voltage fluctuation (dV/dt) in the high side circuit 10. Also, as the switch elements 16 and 17 are not simultaneously driven so as to be turned on, the effect of in-phase noise commingled in the two switch elements 16 and 17 is easily and effectively eliminated, and each of the pulse signals can be reliably detected.

Therefore, the category of an abnormality occurring in the high side circuit 10 can be accurately identified in the low side circuit 20 from pulse signals transmitted via each of the switch elements 16 and 17. In particular, as the categories of three kinds of abnormality occurring in the high side circuit 10 can be easily and reliably transmitted to the low side circuit 20 using the two switch elements 16 and 17, there are a large number of practical advantages.

The signal transmission circuit 1 can also be configured so that the three switch elements PM1, PM2, and PM3 are provided in parallel, and signal transmission from the high side circuit 10 to the low side circuit 20 is carried out by pulse signals causing the switch elements PM1, PM2, and PM3 to be alternatively turned on being generated. In this case, it is sufficient that, for example, a pulse signal causing only one of the switch elements PM1, PM2, and PM3 to be turned on and off in a first cycle, and a second cycle pulse signal causing two of the switch elements PM1, PM2, and PM3 to be alternately turned on and off, are generated in accordance with the category of an abnormality occurring in the high side circuit 10. By so doing, six kinds of abnormality category, including a state of no abnormality, can be transmitted.

Next, a description will be given of the signal transmission circuit 1 according to a second embodiment of the invention.

Figure 12:
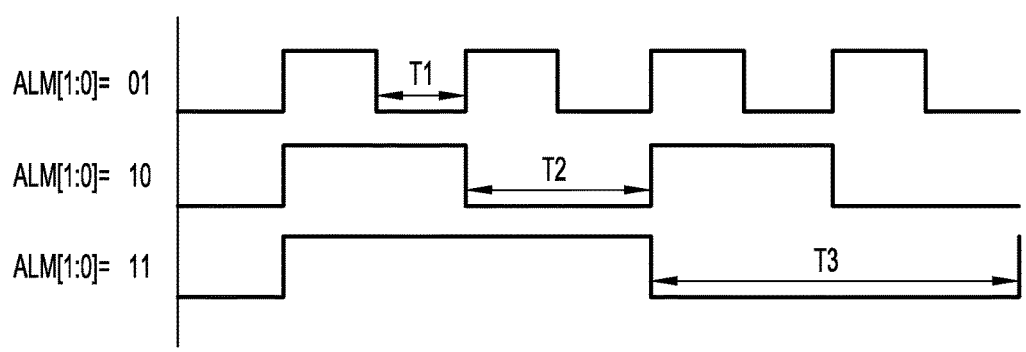
FIG. 12 is a diagram showing an outline of signal transmission according to a second embodiment of the invention.

In this embodiment, three kinds of pulse signal of differing pulse widths are generated, as shown in, for example, FIG. 12, in accordance with the abnormality detection signals OHE, OCE, and UVE obtained in accordance with the signal category order of priority by the previously described arbiter circuit 14. Further, the pulse signals are configured so as to be transmitted to the low side circuit 20 via only the one switch element 16, as shown in, for example, FIG. 13. Herein, pulse widths T1, T2, and T3 of the three kinds of pulse signal are set as "T2=2·T1" and "T3=2·T2=4·T1", as shown in, for example, FIG. 12.

These kinds of pulse signal of the pulse widths T1, T2, and T3 in accordance with the abnormality signal category are generated using, for example, a 3-bit counter 18, which counts reference clock signals of a predetermined frequency, and a multiplexer 19, which selects the output of the counter 18. Specifically, the pulse signals are generated by, for example, controlling the operations of the counter 18 and multiplexer 19 in accordance with the abnormality detection signals OHE, OCE, and UVE indicating the abnormality signal categories formed of the two bits of data "01", "10", and "11". Further, the switch element 16 is continuously driven so as to be turned on and off using the pulse signals of the pulse widths T1, T2, and T3.

Meanwhile, using a pulse signal obtained by voltage conversion via the voltage conversion unit 21a, a capacitor C2 is charged over the duration of the pulse signal in the low side circuit 20. Further, the charge voltage of the capacitor C2 is compared with each of reference voltages Vref1, Vref2, and Vref3 by three comparators CMP1, CMP2, and CMP3 provided in parallel, and outputs ALM1, ALM2, and ALM3 corresponding to each pulse width are obtained, in a pulse width detection circuit 25. Then, the pulse width detection circuit 25 carries out a masking process on the outputs ALM1, ALM2, and ALM3 of the comparators CMP1, CMP2, and CMP3 via AND gate circuits AND1 and AND2, and selectively outputs one of the outputs ALM1, ALM2, and ALM3.

Figure 13:
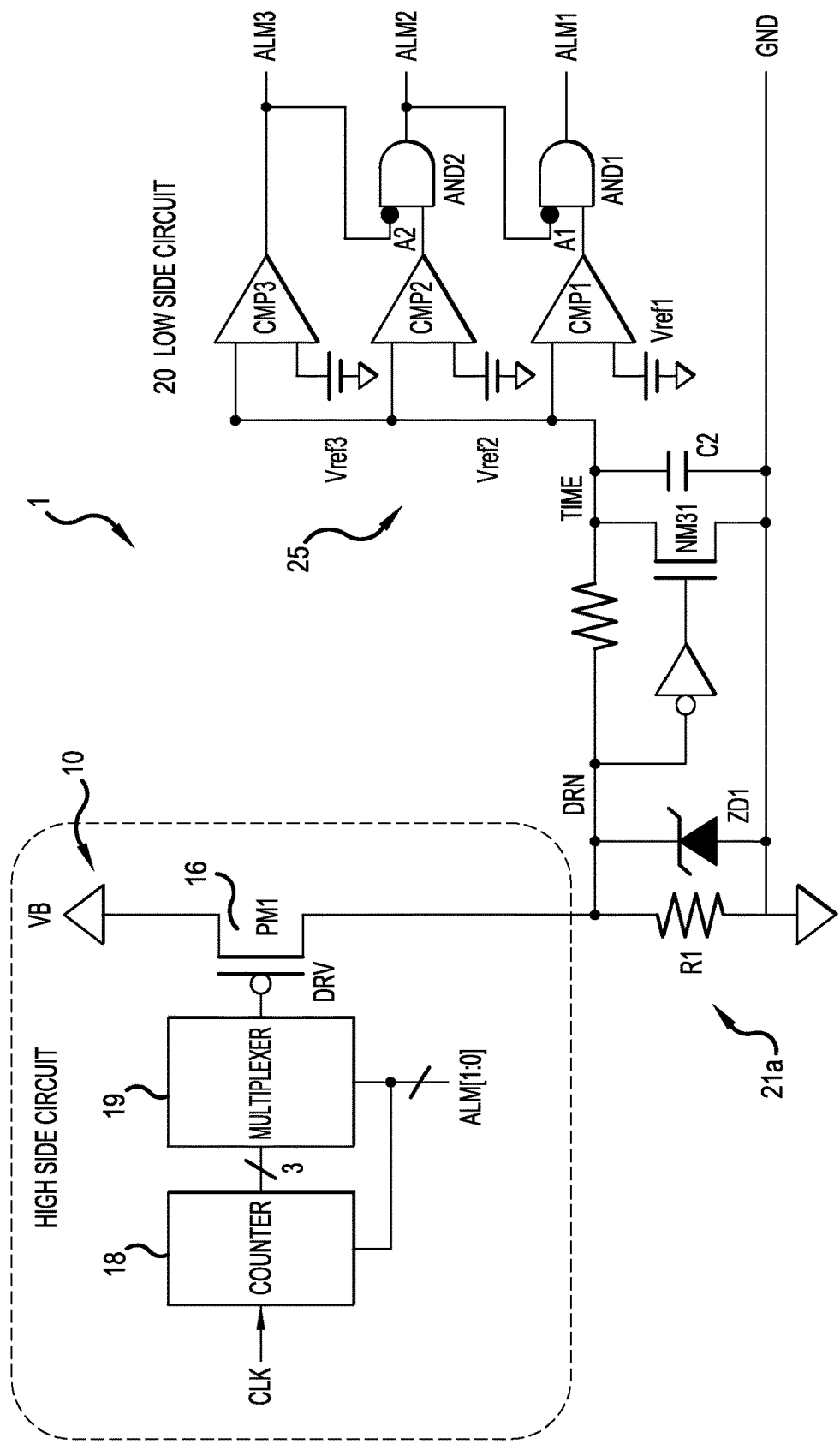
FIG. 13 is a main portion schematic configuration diagram of a signal transmission circuit according to the second embodiment of the invention.

Herein, the configuration in this example is such that the alarm signals are output in an order of priority wherein "ALM1<ALM2<ALM3". Also, the n-channel MOSFET NM31 connected in parallel with the capacitor C2 in FIG. 13 is driven so as to be turned on by the pulse signal inverted via a NOT circuit, and performs a role of releasing the charge of the capacitor C2.

Figure 14:
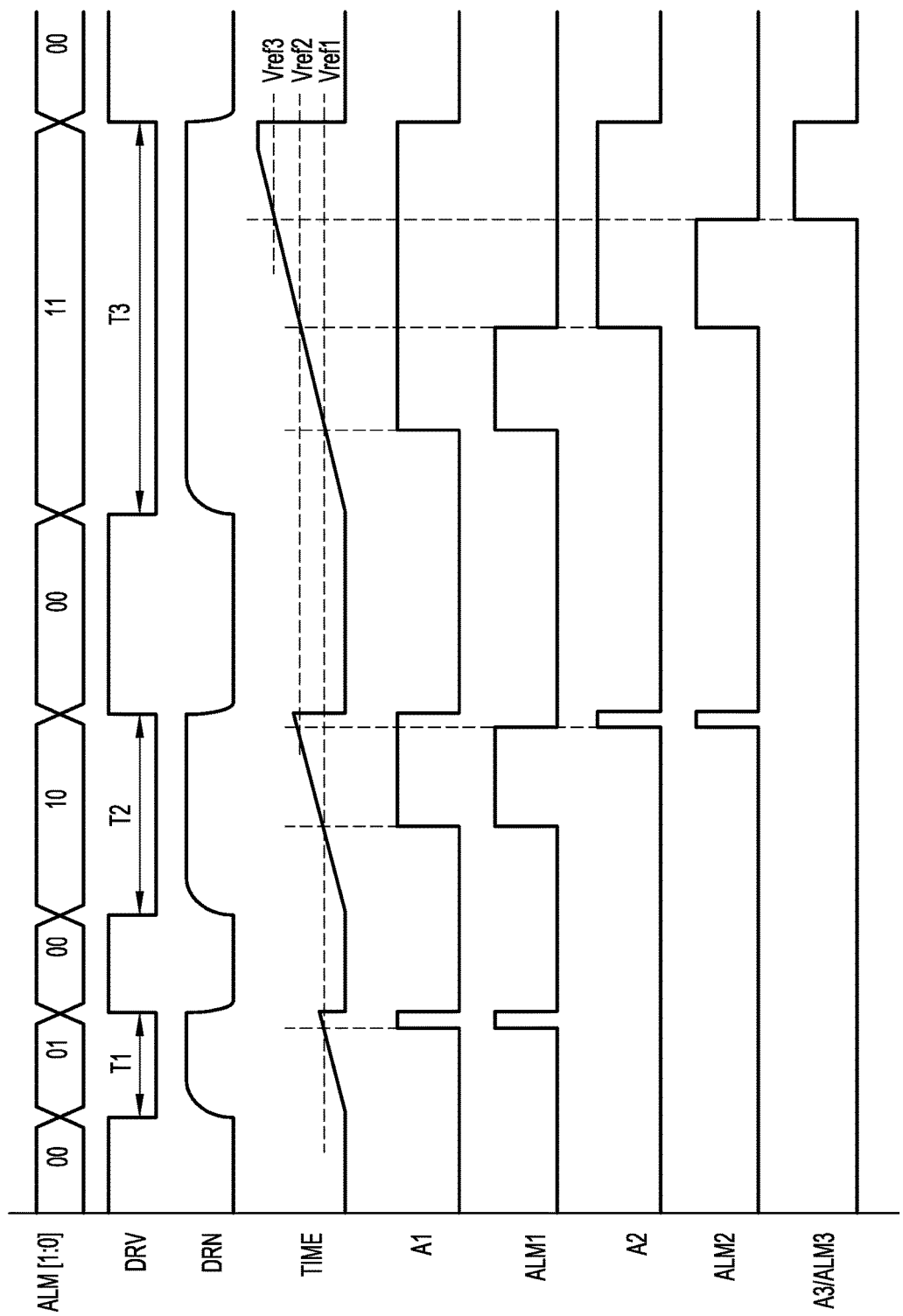
FIG. 14 is a timing diagram showing an aspect of signal transmission by the signal transmission circuit shown in FIG. 13.

In this way, according to the signal transmission circuit 1 configured in this way, the pulse widths T1, T2, and T3 of the pulse signal driving the switch element PM1 so as to be turned on are changed in accordance with the abnormality detection signal category, as shown by the operation timings in FIG. 14, because of which the charge voltage of the capacitor C2 changes in response. Further, when the charge voltage of the capacitor C2 exceeds the reference voltages Vref1, Vref2, and Vref3, the comparators CMP1, CMP2, and CMP3 sequentially invert outputs A1, A2, and A3 thereof.

Further, the outputs A1, A2, and A3 of the comparators CMP1, CMP2, and CMP3 are sequentially masked by the outputs A2 and A3 of the upper level comparators CMP2 and CMP3, of which the reference voltage is set high. As a result of this, provided that the outputs A1, A2, and A3 of the comparators CMP1, CMP2, and CMP3 are extracted at the timing at which the capacitor C2 is reset, the abnormality detection outputs ALM1, ALM2, and ALM3 in accordance with the abnormality category can thereby be alternatively obtained.

Consequently, when transmitting pulse signals of the pulse widths T1, T2, and T3 in accordance with the abnormality category via the switch element 16 too, as heretofore described, the category of an abnormality occurring in the high side circuit 10 can be easily, and moreover reliably, transmitted to the low side circuit 20, in the same way as in the previous embodiment. Moreover, signal transmission indicating the abnormality category can be reliably carried out simply by using the one switch element 16. In the case of this embodiment, however, it cannot be denied that, depending on the setting conditions of the pulse signal pulse widths T1, T2, and T3, time is needed from the signal transmission to the analysis of the pulse signal. Consequently, it goes without saying that it is desirable that the pulse widths T1, T2, and T3 are appropriately set in accordance with an urgency stipulated in accordance with abnormality category.

Also, the invention can also be embodied in the following way.

Figure 15:
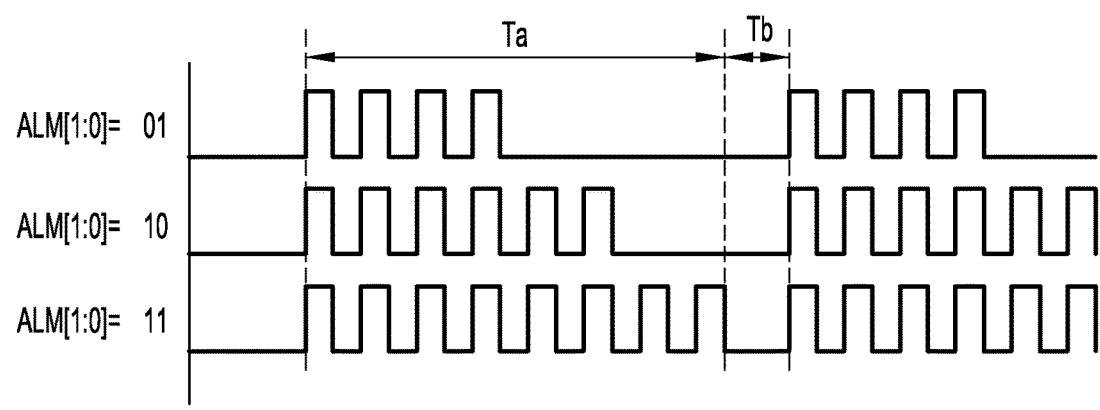
FIG. 15 is a diagram showing an outline of signal transmission according to a third embodiment of the invention.
Figure 16:
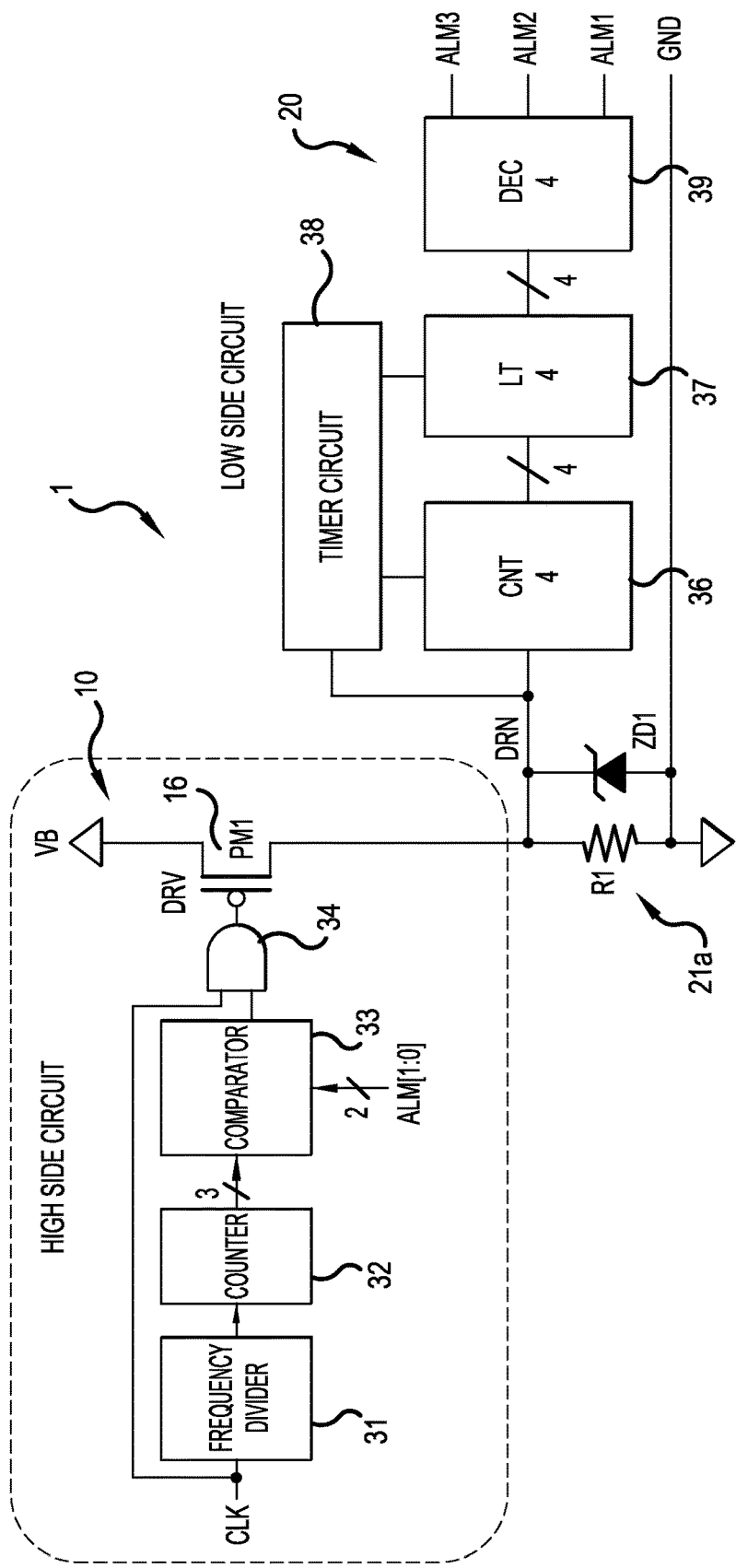
FIG. 16 is a main portion schematic configuration diagram of a signal transmission circuit according to the third embodiment of the invention.

In this third embodiment, three kinds of pulse signal train of differing pulse numbers n are generated, as shown in, for example, FIG. 15, in accordance with the abnormality detection signals OHE, OCE, and UVE obtained in accordance with the signal category order of priority by the previously described arbiter circuit 14. Further, the pulse signal trains are transmitted to the low side circuit 20 via the one switch element 16, as shown in, for example, FIG. 16. Herein, the three kinds of pulse signal train of differing pulse numbers are such that the pulse number n output in a constant signal output period Ta set sandwiching a constant idle period Tb is caused to differ, as shown in, for example, FIG. 15.

In the example shown in FIG. 15, the pulse number n in the signal output period Ta is set as four pulses, six pulses, and eight pulses in accordance with the abnormality detection signals OHE, OCE, and UVE. After the frequency of the reference clock signal CLK is divided by a frequency divider 31 as shown in, for example, FIG. 16, this kind of pulse signal train is counted by a 3-bit counter 32. Then, the value of the counting by the counter 32 and 2-bit alarm information indicating the abnormality detection signals OHE, OCE, and UVE are compared by a comparator 33, an AND gate circuit 34 is controlled in accordance with the result of the comparison, and the reference clock signal CLK is generated by masking.

As a result of this, the number of pulses of the reference clock signal CLK provided to the switch element 16 via the AND gate circuit 34 is limited in accordance with the category of the abnormality detection signals OHE, OCE, and UVE. Further, the switch element 16 is driven so as to be turned on and off a number of times equivalent to the number of pulses of the reference clock signal CLK passing through the AND gate circuit 34 in one operating cycle (Ta+Tb) of the counter 32.

Also, it is sufficient that the category of the abnormality detection signal is analyzed from the pulse number of the pulse signal in the following way in the low side circuit 20 that receives a pulse signal transmitted from the high side circuit 10 in this way. That is, a pulse signal obtained by voltage conversion via the voltage conversion unit 21a is counted by a 4-bit counter 36, and the value of the counting is latched by a latch circuit 37. At this time, the counting operation of the counter 36 and the timing of the latching by the latch circuit 37 are controlled by a timer circuit 38.

Figure 17:
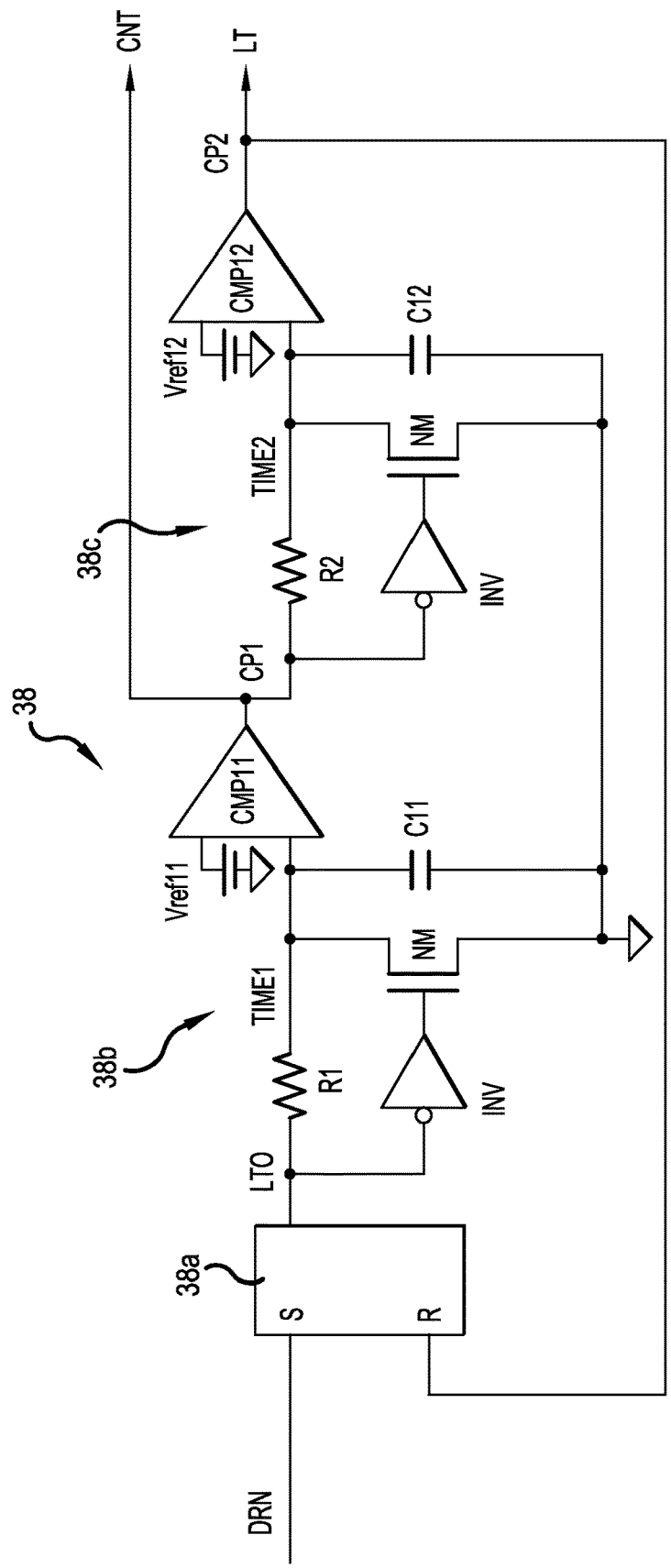
FIG. 17 is a diagram showing a configuration example of a timer circuit shown in FIG. 16.

Herein, the timer circuit 38 includes a flip-flop (FF) 38a that is set by receiving a pulse signal obtained from the voltage conversion unit 21a, as shown in, for example, FIG. 17. Also, the timer circuit 38 includes a first timer 38b that compares the charge voltage of a capacitor C11, charged by receiving the set output of the flip-flop 38a, with a predetermined reference voltage Vref11 in a first comparator CMP11. Further, the timer circuit 38 is configured so that the output period Ta of the pulse signal is obtained by the first timer 38b.

Furthermore, the timer circuit 38 includes a second timer 38c that compares the charge voltage of a capacitor C12, charged by the output of the first comparator CMP11, with a predetermined reference voltage Vref12 in a second comparator CMP12. Further, the timer circuit 38 is configured so that the idle period Tb of the pulse signal is obtained by the second timer 38c. Based on this, the timer circuit 38 is configured so that the first and second timers 38b and 38c are initialized by the flip-flop 38a being reset by the output of the second comparator CMP12, which is the second timer 38c.

According to the timer circuit 38 configured in this way, the flip-flop 38a is set at the point at which a pulse signal transmitted from the high side circuit 10 via the voltage conversion unit 21a is received. Consequently, the first timer 38b starts a timer operation with the timing at which the pulse signal is received as the starting point, and causes a counting operation by the counter 36 to stop at the point at which the period Ta elapses. Consequently, the counter 36 counts only the pulse signals received during the period Ta. In other words, the pulse number of the pulse signal transmitted from the high side circuit 10 in accordance with the category of the abnormality detection signals OHE, OCE, and UVE is obtained by the counter 36.

Subsequently, the latch circuit 37 is started up by the second timer 38c at the point at which the idle period Tb elapses, and the pulse signal pulse number obtained by the counter 36 is latched. Then, the pulse number that is the count value held by the latch circuit 37 is provided to a decoder 39, and an alarm output in accordance with the pulse number is obtained. Herein, the decoder 39 is configured so as to change the outputs ALM1, ALM2, and ALM3 thereof in accordance with the count value held by the latch circuit 37, as shown in, for example, FIG. 18.

Figure 19:
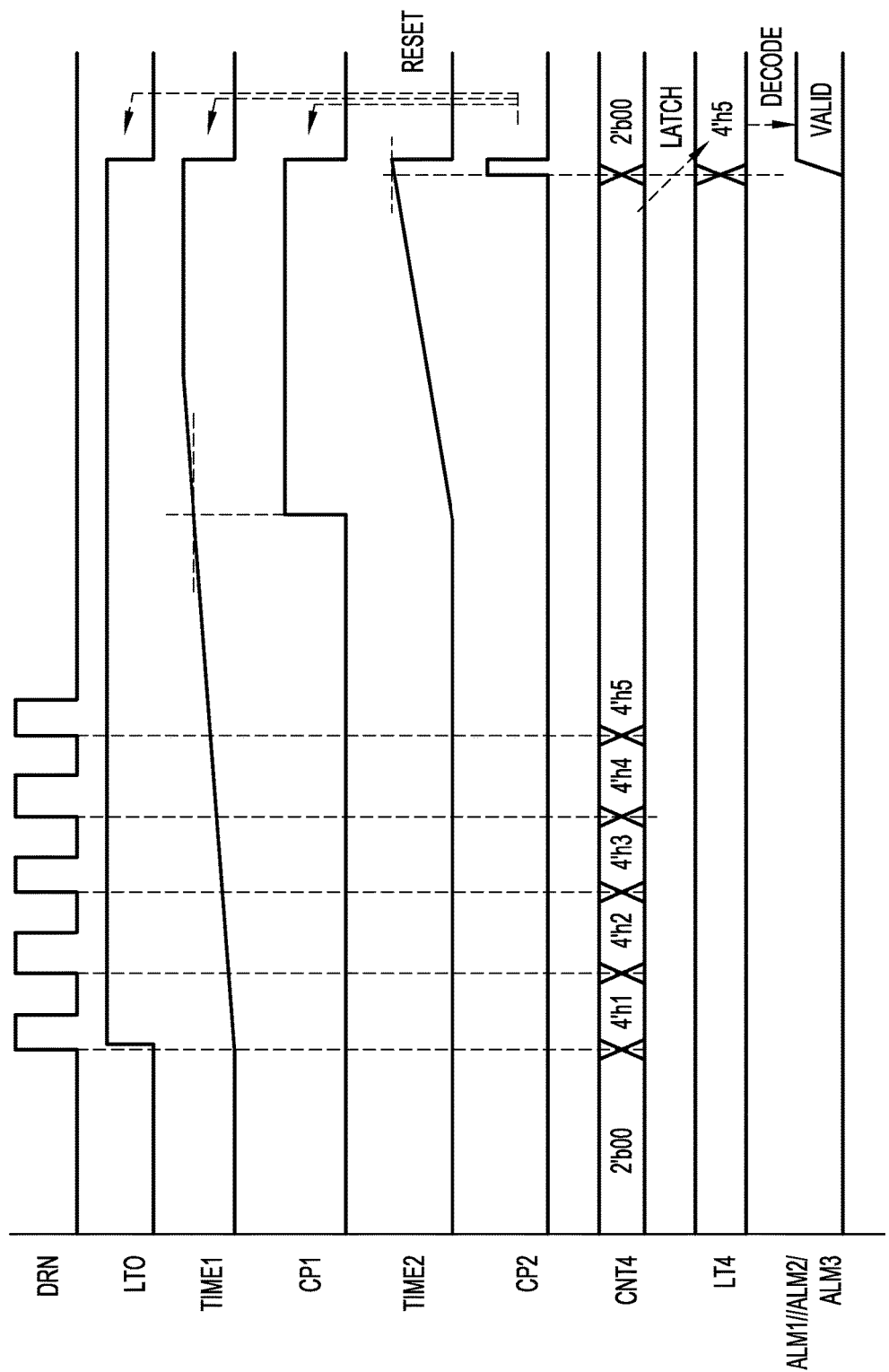
FIG. 19 is a timing diagram showing an aspect of signal transmission by the signal transmission circuit shown in FIG. 16.
Figure 20:
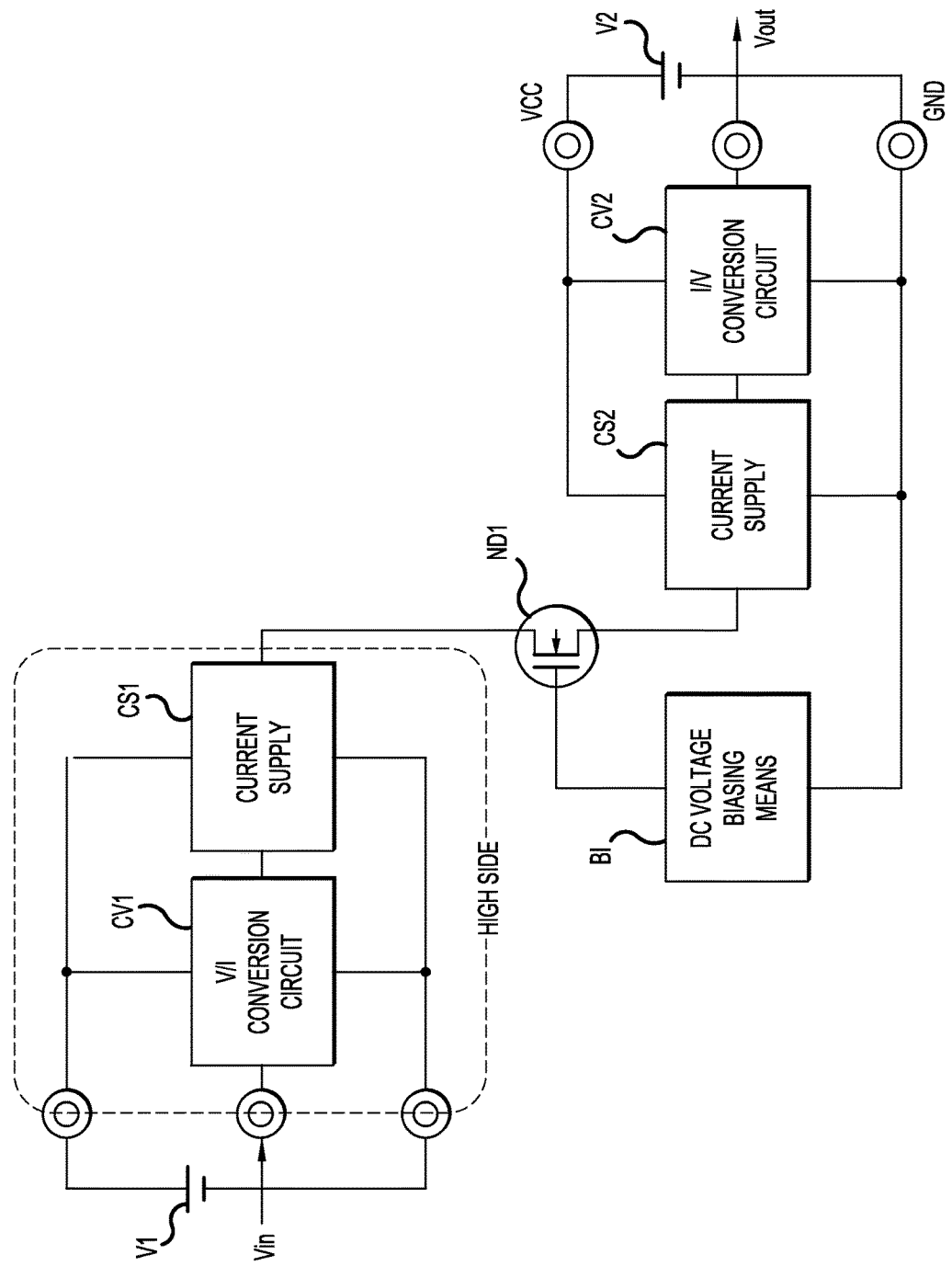
FIG. 20 is a configuration diagram showing an example of an existing signal transmission circuit.

Consequently, according to the signal transmission circuit 1 configured as heretofore described, the output pulse number n in the constant period Ta of a pulse signal that drives the switch element 16 so as to be turned on is changed in accordance with the abnormality detection signal category, as shown by the operation timing thereof in FIG. 19. Therefore, by the pulse signal pulse number detected in the constant period Ta being counted by the counter 36, and the count value being analyzed, the category of an abnormality occurring in the high side circuit 10 can be determined in the low side circuit 20, in the same way as in the previous embodiments.

In particular, according to the signal transmission circuit 1 according to this embodiment, it is sufficient to change the pulse number n in the constant period Ta of a pulse signal transmitted via the switch element 16 in accordance with the abnormality detection signal category, because of which the abnormality detection signal category can be easily, and moreover reliably, transmitted to the low side circuit 20. Moreover, signal transmission indicating the abnormality category can be reliably carried out simply by using the one switch element 16, in the same way as in the previous embodiment. Therefore, the same advantages as in each of the previous embodiments are achieved.

The invention is not limited by the heretofore described embodiments. For example, signal transmission can also be carried out by using a combination of the signal transmission control in the first embodiment and the signal transmission control according to the second or third embodiment. Specifically, the cycle of a continuous pulse signal that continuously causes one of the two switch elements 16 and 17 to be turned on and off may be changed in accordance with the abnormality detection signal category, or the cycle of a pulse signal that causes the two switch elements 16 and 17 to be alternately turned on and off may be changed in accordance with the abnormality detection signal category. By so doing, still more categories of signal can be transmitted from the high side circuit 10 to the low side circuit 20.

Also, it is sufficient that the pulse signal cycle, and the like, in each of the previously described embodiments is set in accordance with specifications such as the frequency with which a signal to be transmitted from the high side circuit 10 to the low side circuit 20 occurs and the urgency of the signal transmission. Various other modifications are possible without departing from the scope of the invention.

What is claimed is:

1. A signal transmission circuit, comprising:
   an output circuit, provided in a high side circuit that operates with a first potential as a reference potential, that selectively generates and outputs a plurality of kinds of pulse signal in accordance with the level of priority of a plurality of signals;
   a plurality of switch elements, driven so as to be turned on and off by a plurality of pulse signal outputs from the output circuit, that are turned on and off to transmit the power supply voltage of the high side circuit to a low side circuit that operates with a second potential lower than the first potential as a reference potential;
   a voltage conversion circuit directly connected to the plurality of switch elements, provided in the low side circuit, that converts the power supply voltage transmitted via the switch elements into pulse signals of predetermined voltages with the second potential as a reference potential; and
   a signal analysis circuit that analyzes the pulse signals obtained via the power conversion circuit and restores the plurality of signals,
   wherein the output circuit turns the switch elements on and off by generating pulse signal trains of differing pulse numbers in accordance with an alarm signal category in accordance with the level of priority of the plurality of signals, and
   wherein the output circuit selectively generates the plurality of kinds of pulse signal that alternatively cause a plurality of the switch elements provided in parallel to be turned on,
   the voltage conversion circuit converts each of the voltages selectively transmitted via the switch elements into a pulse signal of a predetermined voltage, with the second potential as a reference potential, and outputs the plurality of kinds of pulse signal in parallel, and the signal analysis circuit includes in parallel multiple stage latch circuits that sequentially latch the plurality of kinds of pulse signal category by category in synchronization with a clock signal generated from the plurality of kinds of pulse signal output in parallel from the voltage conversion circuit, analyzes the signal level held in each of the latch circuits, and restores the plurality of signals.

2. The signal transmission circuit according to claim 1, wherein the plurality of signals are a plurality of kinds of abnormality detection signal.

3. The signal transmission circuit according to claim 1, wherein the clock signal is generated as a signal synchronized with the inversion timing of one of the plurality of kinds of pulse signal output in parallel from the voltage conversion circuit.

4. The signal transmission circuit according to claim 1, wherein the signal analysis circuit determines that there is a reception error when the signal level held in each of the latch circuits indicates that the plurality of switch elements are simultaneously in an on-state.

5. The signal transmission circuit according to claim 1, wherein the voltage conversion circuit converts the voltage selectively transmitted via each switch element into a pulse signal with the second potential in the low side circuit as a reference potential and charges a capacitor each time the pulse signal is detected for a certain time, and the signal analysis circuit determines the charge voltage of the capacitor after the certain time and restores the plurality of signals.

6. A signal transmission circuit, comprising:

an output circuit, provided in a high side circuit that operates with a first potential as a reference potential, that selectively generates and outputs a plurality of kinds of pulse signal in accordance with the level of priority of a plurality of signals;

a switch element, driven so as to be turned on and off by a plurality of pulse signal outputs from the output circuit, that is turned on and off to transmit the power supply voltage of the high side circuit to a low side circuit that operates with a second potential lower than the first potential as a reference potential;

a voltage conversion circuit directly connected to the switch element, provided in the low side circuit, that converts the power supply voltage transmitted via the switch element into pulse signals of predetermined voltages with the second potential as a reference potential; and a signal analysis circuit that analyzes the pulse signals obtained via the power conversion circuit and restores the plurality of signals, wherein the output circuit turns the switch element on and off by generating pulse signal trains of differing pulse numbers in accordance with an alarm signal category in accordance with the level of priority of the plurality of signals, and wherein the output circuit turns the switch element on and off by generating pulse signals of differing pulse widths in accordance with signal category in accordance with the level of priority of the plurality of signals.

7. The signal transmission circuit according to claim 6, wherein the voltage conversion circuit converts the voltage selectively transmitted via the switch element into a pulse signal with the second potential in the low side circuit as a reference potential and charges a capacitor for the duration of the pulse signal, and the signal analysis circuit determines the charge voltage of the capacitor and restores the plurality of signals.

* * * * *